(12) United States Patent
Mahajan et al.

(10) Patent No.: US 12,224,184 B2
(45) Date of Patent: Feb. 11, 2025

(54) METHODS FOR REGISTRATION OF CIRCUIT DIES AND ELECTRICAL INTERCONNECTS

(71) Applicant: 3M INNOVATIVE PROPERTIES COMPANY, St. Paul, MN (US)

(72) Inventors: Ankit Mahajan, Cupertino, CA (US); Saagar A. Shah, Minneapolis, MN (US); Mikhail L. Pekurovsky, Bloomington, MN (US); Kayla C. Niccum, Maplewood, MN (US); Kara A. Meyers, Oakdale, MN (US); Matthew R. D. Smith, Woodbury, MN (US); Gino L. Pitera, St. Paul, MN (US); Graham M. Clarke, Woodbury, MN (US); Jeremy K. Larsen, Farmington, MN (US); Teresa M. Goeddel, St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 18/652,529

(22) Filed: May 1, 2024

(65) Prior Publication Data
US 2024/0282592 A1  Aug. 22, 2024

Related U.S. Application Data

(62) Division of application No. 17/594,346, filed as application No. PCT/IB2020/053517 on Apr. 14, 2020, now Pat. No. 12,020,951.
(Continued)

(51) Int. Cl.
*H01L 21/56* (2006.01)
*H01L 23/00* (2006.01)
(Continued)

(52) U.S. Cl.
CPC ............ *H01L 21/56* (2013.01); *H01L 23/293* (2013.01); *H01L 23/3107* (2013.01);
(Continued)

(58) Field of Classification Search
CPC ... H01L 21/56; H01L 23/293; H01L 23/3107; H01L 24/03; H01L 24/05;
(Continued)

(56) References Cited

U.S. PATENT DOCUMENTS

| 5,497,033 A | 3/1996 | Fillion et al. |
| 7,028,400 B1 | 4/2006 | Hiner et al. |

(Continued)

FOREIGN PATENT DOCUMENTS

| KR | 20180090941 A | 8/2018 |
| WO | 2018094057 A1 | 5/2018 |

(Continued)

OTHER PUBLICATIONS

International Search Report for PCT International Application No. PCT/IB2020/053517, mailed on Sep. 14, 2020, 3 pages.

*Primary Examiner* — Thanh T Nguyen
(74) *Attorney, Agent, or Firm* — Thomas M. Spielbauer

(57) ABSTRACT

A method includes placing an electronic device on a pliable mating surface on a major surface of a mold such that at least one contact pad on the electronic device presses against the pliable mating surface. The pliable mating surface is on a microstructure in an arrangement of microstructures on the major surface of the mold. A liquid encapsulant material is applied over the electronic device and the major surface of the mold, and then hardened to form a carrier for the electronic device. The mold and the carrier are separated such that the microstructures on the mold form a corresponding arrangement of microchannels in the carrier, and at least one contact pad on the electronic device is exposed in (Continued)

a microchannel in the arrangement of microchannels. A conductive particle-containing liquid is deposited in the microchannel, which directly contacts the contact pad exposed in the microchannel.

5 Claims, 3 Drawing Sheets

Related U.S. Application Data

(60) Provisional application No. 62/840,072, filed on Apr. 29, 2019.

(51) Int. Cl.
*H01L 23/29* (2006.01)
*H01L 23/31* (2006.01)

(52) U.S. Cl.
CPC .............. *H01L 24/03* (2013.01); *H01L 24/05* (2013.01); *H01L 2224/03312* (2013.01); *H01L 2224/0332* (2013.01); *H01L 2224/03505* (2013.01); *H01L 2224/03515* (2013.01); *H01L 2224/04105* (2013.01); *H01L 2224/05567* (2013.01)

(58) Field of Classification Search
CPC ... H01L 2224/03312; H01L 2224/0332; H01L 2224/03505; H01L 2224/03515; H01L 2224/04105; H01L 2224/05567; H01L 21/6836; H01L 2223/6672; H01L 2223/6677; H01L 21/568; H01L 23/3114; H01L 24/96; H01L 2224/12105; H01L 2224/29294; H01L 2224/29339; H01L 2224/29347; H01L 2224/29393; H01L 2924/1815; H05K 3/0014; H05K 2203/308; H05K 1/113; H05K 1/186
See application file for complete search history.

(56) References Cited

U.S. PATENT DOCUMENTS

| | | |
|---|---|---|
| 11,574,849 B2 | 2/2023 | Gmundner et al. |
| 2011/0045577 A1 | 2/2011 | Bruzewicz et al. |
| 2013/0307145 A1* | 11/2013 | Chung .................... H01L 24/97 257/737 |
| 2014/0097536 A1 | 4/2014 | Schunk |
| 2014/0367160 A1* | 12/2014 | Yu ........................ H01L 21/7684 174/377 |
| 2017/0147857 A1* | 5/2017 | Liu ......................... H01L 24/46 |
| 2018/0254566 A1 | 9/2018 | Holbery et al. |
| 2021/0296260 A1 | 9/2021 | Chou et al. |
| 2022/0037278 A1* | 2/2022 | Mahajan ............. H01L 23/3121 |

FOREIGN PATENT DOCUMENTS

| | | |
|---|---|---|
| WO | 2019171214 A1 | 9/2019 |
| WO | 2020141407 A1 | 7/2020 |

* cited by examiner

METHODS FOR REGISTRATION OF CIRCUIT DIES AND ELECTRICAL INTERCONNECTS

CROSS REFERENCE TO RELATED APPLICATIONS

This application is a divisional of U.S. application Ser. No. 17/594,346, filed 12 Oct. 2021, now allowed, which is a US 371 Application based on IB2020/053517, filed on 14 Apr. 2020, which claims the benefit of U.S. Provisional Application No. 62/840,072, filed 29 Apr. 2019, the disclosures of which are incorporated by reference in their entirety herein.

BACKGROUND

Flexible electronics will greatly expand the application space for microelectronics and deliver new functional capabilities in a variety of commercial areas. A robust manufacturing platform is needed to produce fast, low-power circuits on substrates such as plastic, rubber, paper, and metal foil. Web-based printing of solid semiconductor dies combines the computational prowess of semiconductor technology with the high-throughputs and form-factor flexibility of roll-to-roll manufacturing processes. Flexible hybrid electronics manufacturing requires that semiconductor dies be reliably and accurately registered to printed traces on moving webs. Current alignment mechanisms suitable for wafer-based semiconductor devices, such as pick and place procedures, may not be readily transferred to web-based processes, and may not be able to provide the cost, precision, and area scaling necessary for many intended applications.

Techniques are needed to consistently and accurately achieve registration at a level of less than about ten micrometers between solid circuit dies and electrically conductive interconnects on a substrate, in particular, a moving, flexible substrate utilized in a roll-to-roll manufacturing process.

SUMMARY

In general, the present disclosure is directed to methods for manufacturing high performance, multi-functional flexible electronics systems over large areas in a cost-effective manner. The present disclosure is directed to articles and methods that provide automatic registration via liquid flow of a conductive particle-containing liquid to electrically interconnect aligned or registered circuit traces or the electrically conductive contact pads of electronic components such as, for example, a circuit die, placed on a moving, pliable substrate. The automatic registration described herein can be tolerant of various sources of misalignment in web-based processes such as, for example, a substrate distortion from in-line thermal cycles and/or tension control.

In one aspect, the present disclosure is directed to a method including placing on a pliable mating surface on a major surface of a mold an electronic device with an arrangement of contact pads such that at least one contact pad in the arrangement of contact pads presses against the pliable mating surface. The pliable mating surface is on a microstructure in an arrangement of microstructures on the major surface of the mold. A liquid encapsulant material is applied over the electronic device and the major surface of the mold and hardened to form a carrier for the electronic device. The carrier is separated from the mold such that the microstructures on the mold form a corresponding arrangement of microchannels in the carrier, wherein the at least one contact pad on the electronic device is exposed in a microchannel in the arrangement of microchannels. A conductive particle-containing liquid is deposited in the microchannel such that the conductive particle-containing liquid directly contacts the contact pad exposed in the microchannel.

In another aspect, the present disclosure is directed to method including placing on a major surface of a mold an electronic device with an arrangement of electrically conductive contact pads such that at least one contact pad in the arrangement of contact pads presses against a pliable mating surface on at least one ridge in an arrangement of ridges extending upward from the major surface of the mold. A liquid encapsulant material is then applied to cover the electronic device and occupy regions between the electronic device and the mold, and hardened to form a carrier for the electronic device. The mold is removed from the carrier, wherein a major surface of the carrier then has an arrangement of channels corresponding to the arrangement of ridges in the mold, and wherein the at least one contact pad is exposed in the channel to form an electrical contact site in an interconnect channel. The carrier is inverted and a conductive particle-containing liquid is deposited in the interconnect channel, primarily by capillary pressure, such that the conductive particle-containing liquid directly contacts the electrical contact site.

In another aspect, the present disclosure is directed to a method including placing a solid circuit die on a pliable mold with a major surface having a plurality of linear ridges extending upward therefrom. At least a portion of the array of ridges is configured to correspond to a plurality of electrically conductive contact pads on the solid circuit die. The die is placed on the major surface of the mold such that at least a portion of the contact pads in the array of contact pads directly contact and releasably seal against mating surfaces on exposed tops of at least a portion of the ridges in the array of ridges. A liquid encapsulant material is deposited on the major surface of the mold to cover the solid circuit die and occupy valley regions between the linear ridges on the mold. The liquid encapsulant material is at least partially cured to form a polymeric carrier for the electronic device. The mold is then separated from the polymeric carrier, wherein a major surface of the polymeric carrier has a plurality of linear channels corresponding to the array of linear ridges in the mold, and at least a portion of the contact pads on the solid circuit die are exposed in the linear channels to form electrical contact sites. The polymeric carrier is then inverted and a conductive particle-containing liquid is disposed in a second end of the linear channels such that the conductive particle-containing liquid flows along the linear channels via capillary pressure from the second end to the first end thereof and directly contacts the exposed electrical contact sites. The conductive particle-containing liquid is hardened to form a plurality of solid electrically conductive traces directly contacting the electrical contact sites on the solid circuit die.

In another aspect, the present disclosure is directed to an article including a solid circuit die with a plurality of electrically conductive contact pads. At least a portion of the contact pads in the array of contact pads directly contact mating surfaces on linear ridges in a plurality of linear ridges extending upward from a major surface of a pliable mold. A polymeric carrier is on the major surface of the pliable mold, wherein the polymeric carrier at least partially encapsulates the solid circuit die, and wherein the polymeric carrier is releasable from the pliable mold along the major surface of the pliable mold to form linear channels corresponding to the ridges in the linear array of ridges and expose for electrical interconnection in the channels at least a portion of the contact pads on the solid circuit die.

The details of one or more embodiments of the invention are set for in the accompanying drawings and the description below. Other features, objects, and advantages of the invention will be apparent from the description and drawings, and from the claims.

BRIEF DESCRIPTION OF DRAWINGS

Like symbols in the drawings indicate like elements.

DETAILED DESCRIPTION

Figure 1A:
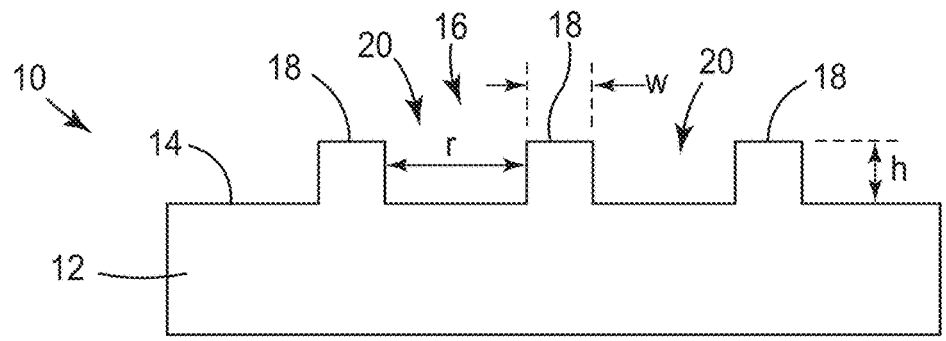
FIG. 1A is schematic cross-sectional view of an embodiment of a substrate including an arrangement of microstructures.

FIG. 1A is a cross-sectional view of an article 10, which includes a substrate 12 with a structured first major surface 14. In some embodiments, the substrate 12 can be a flexible substrate, for example, a web of a polymeric material having an indefinite length. The flexible substrate 12 or web may be stretched (e.g., along a machine direction and/or a cross direction) when moving along a web path between rollers in, for example, a roll-to-roll manufacturing process. The substrate 12 can be made of any suitable materials for forming the features therein or thereon to support fluid flow along the first major surface 14. In some embodiments, which are not intended to be limiting, the flexible substrate 12 is a thermoplastic polymeric film including polyesters (e.g., polyethylene terephthalate (PET), polyester naphthalate (PEN), and polycarbonate (PC)), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulphones such as polyethersulphone, polyimides, silicones such as, for example, polydimethylsiloxane (PDMS), polyethylene, polystyrene, polyurethane, and mixtures and combinations thereof. In some embodiments, the substrate 12 or a portion thereof may be rigid, and suitable rigid materials include, but are not limited to, bakelite, acrylonitrile butadiene styrene (ABS), cured epoxy systems, and the like.

In some example embodiments, the substrate 12 may have a thickness of, for example, 2 mm or less, 1 mm or less, 500 micrometers or less, or 200 micrometers or less.

The first major surface 14 of the substrate 12 includes a plurality of microstructures 18. In the embodiment of FIG. 1A, the microstructures 18 are linear ridges extending away extending along the surface a distance l (not shown in FIG. 1A) and extending from the surface 14 a distance h. However, many different arrays of microstructures 18 are possible, depending on the configuration of the electrical contact pads on the electronic device to be mounted on the substrate 12, and the microstructures 18 may have any suitable shape and dimensions as desired to form a selected electrical interconnection. In the embodiment of FIG. 1A, the array 16 of the linear ridge-like microstructures 18 have a width w and form a corresponding array of microchannels 20 with a width r. While two microchannels 20 are shown in the embodiment of FIG. 1A, it is to be understood that any number of microchannels 20 can be formed on the surface 14 of the substrate 12, and the microchannels 20 can be fluidly connected in various configurations as needed to form electrical connections to circuit elements, electronic devices, and the like.

In various embodiments, the microstructures 18 formed on the major surface 14 have minimum dimensions (l, w and h) of, for example, 500 micrometers or less, 300 micrometers or less, 100 micrometers or less, 50 micrometers or less, or 10 micrometers or less.

The microstructures 18 may be formed or patterned on the surface 14 of the substrate 12 by any suitable technique such as chemical etching, laser etching or drilling, mechanical punching, casting or molding against a microstructured polymeric or metal tool, and the like. In some embodiments, the microstructures 18 can be patterned by adding materials on the major surface 14 by any suitable technique including, for example, microreplication, hot embossing, molding, soft lithography, etching, flexographic printing, 3D printing, and the like.

In the embodiment of FIG. 1A, the array 16 of microchannels 18 includes linear ridges, but in alternative embodiments linear indentations may be formed into the major surface 14 of the substrate 12.

To fully form a suitable array 16 of microstructures 18, the substrate 12 can optionally be treated to prior to or after patterning with techniques such as, for example, solvent or chemical washing, heating, plasma treatment, ultraviolet radiation (UV)-ozone treatment, corona discharge, and combinations thereof.

Figure 1B:
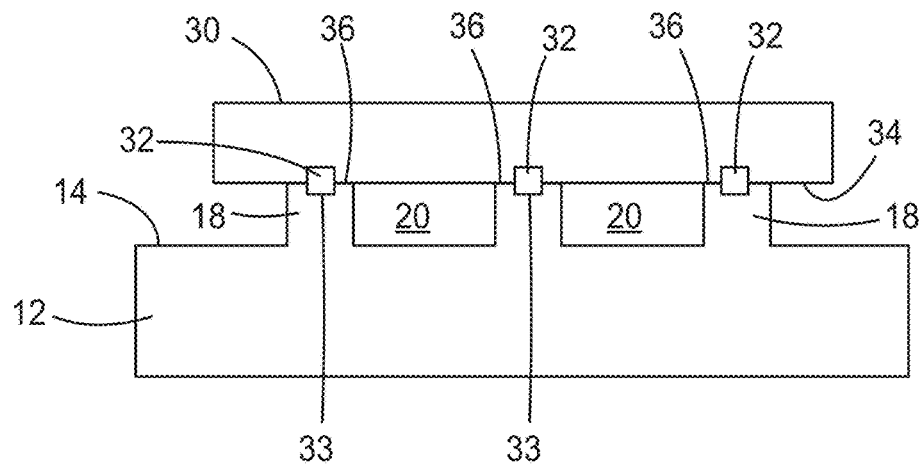
FIG. 1B is a schematic cross-sectional view of an embodiment of an article including the substrate of FIG. 1A having an electronic device placed thereon.

Referring now to FIG. 1B, a solid circuit die 30 is placed on the first major surface 14 of the substrate 12. The solid circuit die 30 includes at least one contact pad 32 on a surface 34 thereof. In the embodiment of FIG. 1B, at least some of the contact pads 32 on the solid circuit die 30 are at least partially embedded in a pliable exposed mating surface 36 on the microstructures 18. In the present application the term embedded refers to a portion 33 of the contact pad 32 that is fixed against a mating surface 36 of a microstructure 18 such that at least a portion of the contact pad lies below the mating surface 36 of the microstructure 18, and when so embedded is unavailable for electrical interconnection with another circuit trace or electronic component. In various embodiments, the embedded electrically conductive surfaces 33 of the contact pad 32 may be embedded in the pliable mating surface 36 by any number of techniques such as, for example, by applying pressure to the solid circuit die 30, by heating the mating surface 36, or a combination thereof.

In various embodiments, which are not intended to be limiting, the circuit die 30 can include a circuit chip having one or more contact pads arranged along the surface 34 thereof, a rigid semiconductor die, a printed circuit board (PCB), a flexible printed circuit (FPC), an ultra-thin chip, a radio frequency identification device (RFID), a near field communication (NFC) module, and the like. In one non-limiting example, the circuit die 30 is an ultra-thin chip with a thickness of about 2 micrometers to about 200 micrometers, about 5 micrometers to about 100 micrometers, or about 10 micrometers to about 100 micrometers. In some embodiments, the ultra-thin circuit die may be loaded on a removable handle substrate (not shown in FIG. 1A) to facilitate the disposition onto the mating surface 36 on the microstructures 18.

The contact pads 32 on the solid circuit die 30 may be made of any suitable electrically conductive materials such as, for example, metals. While the contact pad 32 is shown as having a linear or bump-like shape, the shape and size of the contact pads 32 may vary with the specific types of circuit die, and may include, for example, elongate legs extending from the casing of the circuit die 30. In some embodiments, the contact pads 32 may include electroplated metals (e.g., copper, silver, gold) on the surface of the casing of the circuit die 30.

In some embodiments, the surface 34 of the circuit die 30 can optionally be attached to the mating surfaces 36 of the microstructures 18 with an adhesive (not shown in FIG. 1B). Suitable adhesives include, but are not limited to, structural adhesives, acrylic adhesives, epoxy adhesive, urethane adhesives, optical adhesives, and mixtures and combinations thereof. In some embodiments, the adhesive can be a UV curable adhesive such as, for example, a UV curable polyurethane.

Figure 1C:
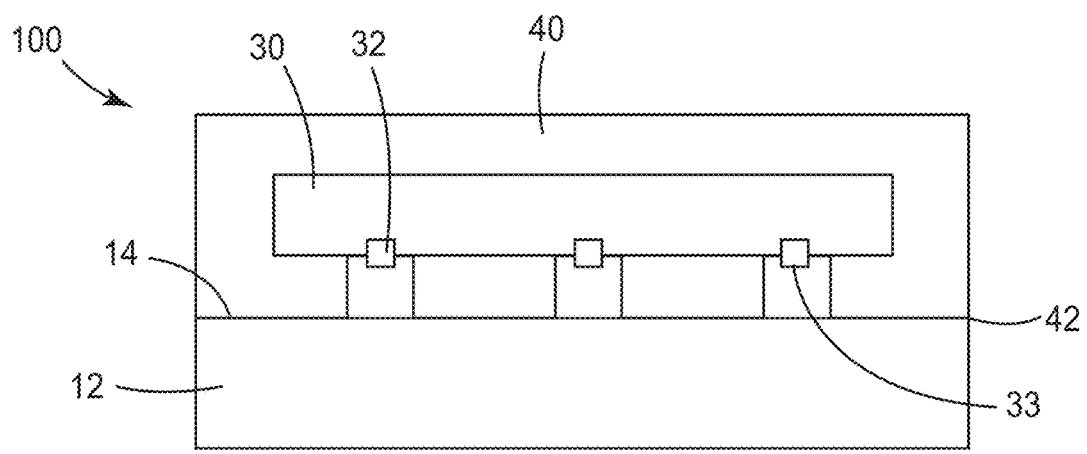
FIG. 1C is a schematic cross-sectional view of the article of FIG. 1B with a liquid encapsulant material applied thereon.

Referring now to FIG. 1C, an article 100 includes a liquid encapsulant material 40 that has been applied over the major surface 14 of the substrate 12. In various embodiments, the liquid encapsulant material 40 may include, for example, a dielectric material, a pre-polymeric material, a polymeric material, and the like. Examples of suitable liquid encapsulant materials 40 include, but are not limited to, polyurethane, epoxy, polythiolene, acrylates including urethane acrylates, silicones, and polydimethylsiloxane (PDMS). The liquid encapsulant material 40 flows around and covers the solid circuit die 30, and forms an interface 42 with the first major surface 14 of the substrate 12. In some embodiments, the liquid encapsulant material 40 does not contact all or a portion of the embedded electrically conductive surfaces 33 of the contact pads 32 on the circuit die 30, but instead fills the microchannels 20.

Figure 1D:
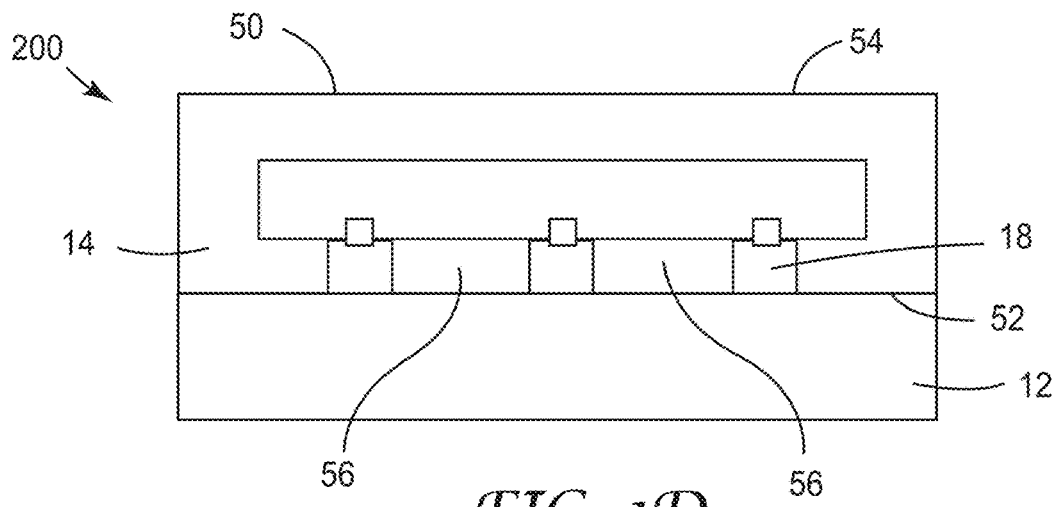
FIG. 1D is a schematic cross-sectional view of the article of FIG. 1C with a hardened liquid encapsulant material.

Referring now to FIG. 1D, in the article 200 the liquid encapsulant material 40 of FIG. 1C is hardened to form a carrier 50 for the solid circuit die 30. Suitable techniques for hardening the liquid encapsulant material 40 include, for example, heating, application of actinic radiation, and the like. Once hardened, the carrier 50 includes a first major surface 52 contacting the first major surface 14 of the substrate 12, and a second major surface 54. The hardened liquid encapsulant material present in the microchannels 20 (FIG. 1B) forms an arrangement of posts 56 on the carrier 50 separated by the microstructures 18 on the substrate 12.

Figure 1E:
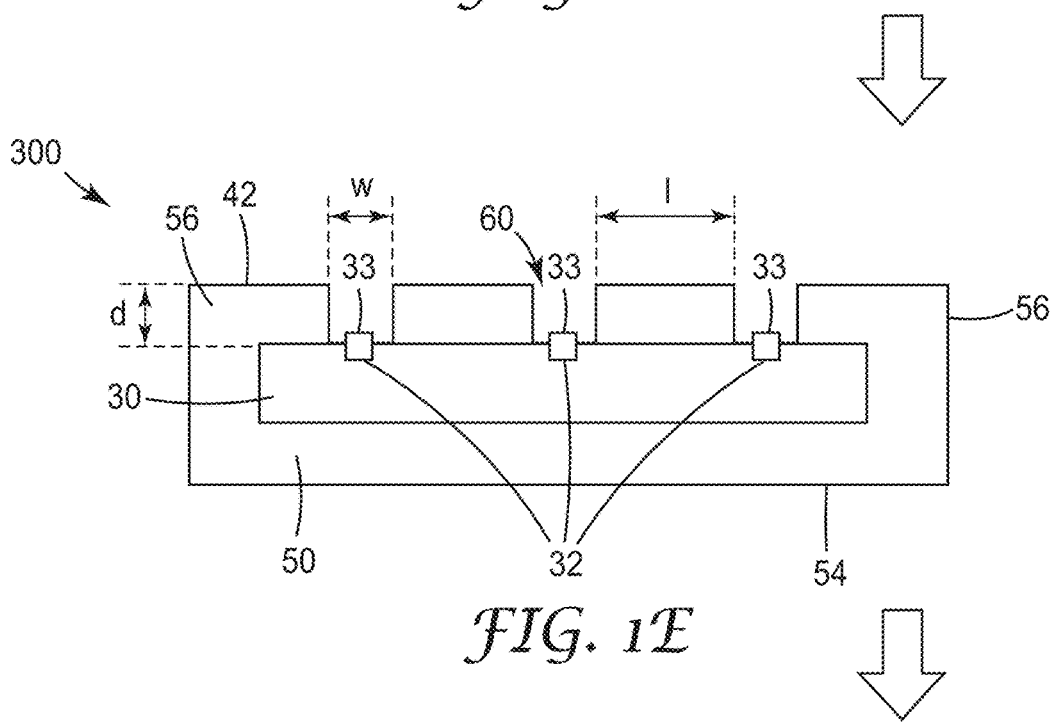
FIG. 1E is a schematic cross-sectional view of the hardened liquid encapsulant material as separated from the substrate to form a carrier for the electronic device, wherein the carrier includes an arrangement of microchannels corresponding to the microstructures on the substrate.

As shown in FIG. 1E, to form an article 300 the carrier 50 is then separated from the substrate 12 of FIG. 1D, and then optionally inverted to expose the first major surface 52 thereof. In some embodiments, the substrate 12 of FIG. 1D is stripped from the hardened carrier 50 along the interface 42. The substrate 12 is cleanly removed along the interface 42, which at least partially exposes the previously embedded portions 33 of the contact pads 32 on the solid circuit die 30, and leaves the solid circuit die 30 at least partially embedded in the carrier 50. In the present application, the term exposed refers to a portion of a circuit trace or an electronic component that is at least partially uncovered and available for electrical interconnection with another circuit trace or electronic component. In an alternative embodiment, if the embedded portions 33 of the contact pads 32 are insufficiently exposed to form an electrical interconnection after separating the carrier 50 from the substrate 12, then the contact pads 32 may optionally be further treated to remove from the portions 33 any residual hardened encapsulant material or material from the substrate 12. Suitable treatment methods to more fully expose the portions 33 include, but are not limited to, application of chemical etchants, removal with a laser, mechanical abrasion, and the like.

Inversion of the carrier 50 exposes the posts 56, and microchannels 60 are formed that correspond to the microstructures 18 on the substrate 12. The microchannels 60 thus have substantially the same dimensions as the microstructures 18, with a length $l$, a width $w$, and a depth $d$ corresponding to the original height $h$ thereof. In various embodiments, the microchannels 60 have a minimum dimension of, for example, 500 micrometers or less, 300 micrometers or less, 100 micrometers or less, 50 micrometers or less, or 10 micrometers or less.

The microchannels 60 are configured with dimensions selected to allow a liquid containing conductive particles placed in the microchannels 60 to flow along the channels. The conductive particle-containing liquid may be placed in the microchannels 60 by any suitable technique, and examples include, but are not limited to, chemical vapor deposition, physical vapor deposition, sputtering, spraying, air knife, gravure, dipping, kiss coating, flood coating, blading, immersion, Meyer rod, roll coating, slot die coating, inkjet printing, lithography, flexographic printing, and mixtures and combinations thereof. In some embodiments, the dimensions of the microchannels 60 are selected such that a conductive particle-containing liquid can be flowed along the channels 60 primarily by capillary force. In some embodiments, the conductive particle-containing liquid can be applied to the microchannels 60 under pressure to enhance capillary flow, or can be moved through the microchannels 60 by a pump, by application of a vacuum, and the like.

Figure 1F:
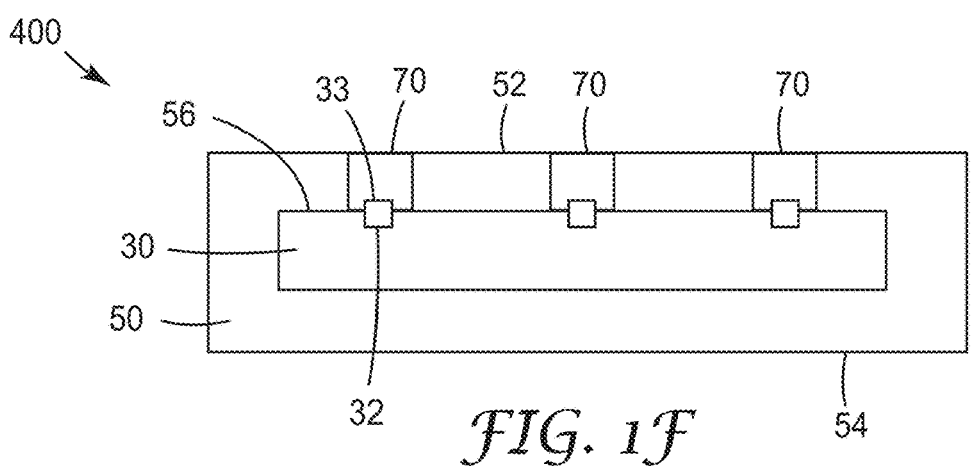
FIG. 1F is a schematic cross-sectional view of the carrier of FIG. 1E having a conductive particle-containing liquid deposited in the microchannels.

Referring to the article 400 shown in FIG. 1F, the conductive particle-containing liquid 70 is deposited in the microchannels 60 and proceeds along the microchannels 60 to overlie the exposed portions 33 of the contact pads 32 on the solid circuit die 30.

In various embodiments, the conductive particle-containing liquid 70 can be any liquid composition that is conductive in a liquid state (for example, metals), or is non-conductive or weakly conductive in a liquid state and becomes electrically conductive when hardened or solidified. The conductive particle-containing liquid 70 can be any liquid composition that is flowable, or can be made to flow, in the microchannels 70. In some embodiments, the conductive particle-containing liquid 70 includes a sufficient amount of a liquid carrier to be flowable in the microchannels 70 primarily by a capillary force. In some embodiments, the conductive particle-containing liquid 70 can be made to flow in the microchannels 60 by applying the liquid 70 under pressure in the microchannels 60 under pressure to enhance capillary flow.

The conductive particle-containing liquid 70 includes an electrically conductive material, or an electrically non-conductive material that can be converted into an electrically conductive material, which is dispersed in liquid form to facilitate more uniform deposition into the microchannels 60 by using, for example, a coater or sprayer. Suitable electrically conductive materials for the conductive particle-containing conductive liquid 70 include, but are not limited to, metal particles, nanowires, metal salts that are conductive at room temperature or become conductive when heated or otherwise reduced to metals, conductive polymers, and mixtures and combinations thereof. In some embodiments, the conductive particle-containing liquid 70 includes conductive inks including a conductive metal such as silver ink, silver nanoparticle ink, reactive silver ink, copper ink, and conductive polymer inks, as well as liquid metals or alloys (e.g., metals or alloys that melt at relatively low temperatures and solidify at room temperatures), and the like. In some embodiments, the conductive particle-containing liquid 70 is a conductive ink that is activated or curable with actinic radiation such as, for example, a UV-curable or activated ink.

In some embodiments, the conductive material in the conductive particle-containing liquid 70 may be silver flakes or spheres, a blend of carbon/graphite particles or a blend of silver flakes/carbon particles. Particle sizes typically range from, for example, about 0.5 micrometers to about 10.0 micrometers in diameter. In an example embodiment, when these flakes or particles are suspended in a liquid carrier such as, for example, a polymeric binder, they are randomly spaced through the liquid carrier. Once the liquid carrier is partially or completely evaporated, they condense, forming a conductive path or circuit. Of the conductive materials, silver is the least resistive and the most expensive while carbon/graphite offers the best combination of low resistance and low price. Suitable conductive inks are available from Tekra, Inc., New Berlin, WI.

Any non-corrosive liquid in which the conductive materials can form a stable dispersion can be used in the conductive particle-containing liquid 70, and suitable examples of liquid carriers include, but are not limited to, water, alcohols, ketones, ethers, hydrocarbons or an aromatic solvent (benzene, toluene, xylene, etc.). In some embodiments, the carrier liquid is volatile, having a boiling point of no more than 200 degrees C. (° C.), no more than 150° C., or no more than 100° C.

In addition, the conductive particle-containing liquid 70 may contain additives or binders to control viscosity, corrosion, adhesion, and dispersion of the conductive material. Examples of suitable additives or binders include, but are not limited to, carboxy methyl cellulose (CMC), 2-hydroxy ethyl cellulose (HEC), hydroxy propyl methyl cellulose (HPMC), methyl cellulose (MC), poly vinyl alcohol (PVA), tripropylene glycol (TPG), and xanthan gum (XG), and surfactants such as ethoxylates, alkoxylates, ethylene oxide and propylene oxide and their copolymers, sulfonates, sulfates, disulfonate salts, sulfosuccinates, phosphate esters, and fluorosurfactants (e.g., those available under the trade designation Zonyl from DowDuPont).

In one example, a conductive particle-containing liquid, or "ink," includes, by weight, from 0.0025% to 0.1% surfactant (e.g., a preferred range is from 0.0025% to 0.05% for Zonyl FSO-100), from 0.02% to 4% viscosity modifier (e.g., a preferred range is 0.02% to 0.5% for HPMC), from 94.5% to 99.0% solvent and from 0.05% to 1.4% conductive materials. Representative examples of suitable surfactants include those available from DowDuPont, Wilmington, DE, under the trade designations Zonyl FSN, Zonyl FSO, and Zonyl FSH, those available from Millipore Sigma, St. Louis, MO, under the trade designations Triton (×100, ×114, ×45), those available from Evonik Industries, Parsippany, NJ, under the trade designations Dynol (604, 607), n-dodecyl b-D-maltoside and Novek. Examples of suitable viscosity modifiers include hydroxypropyl methyl cellulose (HPMC), methyl cellulose, xanthan gum, polyvinyl alcohol, carboxy methyl cellulose, hydroxy ethyl cellulose. Examples of suitable solvents that may be present in a nanowire dispersion that includes the aforementioned binders or additives, include water and isopropanol.

In another embodiment, the conductive particle-containing liquid 70 can include an adhesive such as, for example, adhesives dissolved in liquid solvents such as water acetone, toluene, methyl ethyl ketone (MEK), and the like.

The conductive particle-containing liquid 70 can be cured, hardened or solidified by removing at least portion of the liquid carrier to leave a continuous layer of electrically conductive material that forms an electrically conductive trace in the microchannels 60. The conductive particle-containing liquid 70 may be cured and/or hardened, or sintered. "Cured or solidified" refers to a process where the solvent or liquid carrier is removed from the conductive particle-containing liquid 70 to form an interconnect circuit pattern. Suitable curing conditions are well known in the art and include by way of example, heating, irradiating with visible or ultraviolet (UV) light, electron beams, and the like. Alternatively, "harden(s) or hardening" may be caused by solvent removal during drying, for example, without polymerization or cross-linking.

The conductive particle-containing liquid 70 can be delivered at any position along the microchannels 60, and can be deposited in the microchannels 60 by various methods including, for example, pouring, funneling, ink jet printing, piezo dispensing, needle dispensing, micro-injection, screen printing, flexographic printing, blading, and the like.

Figure 1G:
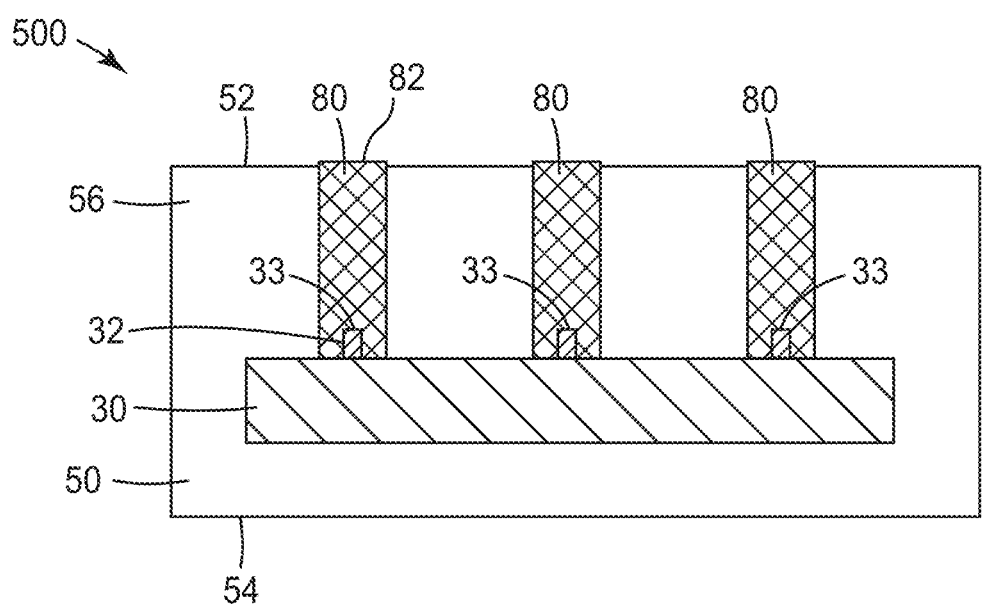
FIG. 1G is a schematic cross-sectional view of the carrier of FIG. 1F in which the conductive particle-containing liquid has been hardened to form electrically conductive traces in the microchannels of the carrier.

Referring now to FIG. 1G, in the article 500 the conductive particle-containing liquid 70 of FIG. 1E can optionally be solidified by removing at least a portion of the liquid carrier therein to form continuous electrically conductive traces 80 in the microchannels 60. The electrically conductive traces 80 can be used to electrically connect one or more of the contact pads 32 on the solid circuit die 30 to another electrically conductive trace or to an electronic component (not shown in FIG. 1G). Suitable processes that can be used to enhance the solidification of the conductive particle-containing liquid 70 to form the conductive traces 80 may include, for example, curing or evaporating by heat or radiation. In some embodiments, during the process of solidification, the volume of the conductive particle-containing liquid 70 decreases when the liquid carrier is removed therefrom. The thickness of the deposited solid material 80 left behind following solidification of the conductive particle-containing liquid 70 depends on the solid loading of the conductive particle-containing liquid 70, but in some embodiments, which are not intended to be limiting, the deposited solid material forming the conductive traces 80 may have a thickness of, for example, from about 0.01 micrometers to about 200 micrometers, from about 0.05 micrometers to about 100 micrometers, or from about 0.1 micrometers to about 10 micrometers.

In some embodiments, the solidification process may leave some void space above an exposed surface 82 of the conductive traces 80. In some embodiments, the void space can optionally be filled or covered with an encapsulant material (not shown in FIG. 1G) to, for example, protect the conductive traces 80 and the contact pads 32 from corrosion, or to enhance the structural strength of the construction 500. The encapsulant material may include, for example, a dielectric material, a polymeric material, and the like. In some embodiments, the encapsulant material can be delivered by capillary liquid flow to fill the open regions of the microchannels 60 following solidification of the conductive particle-containing liquid 70.

In some embodiments, either or both of the flexible substrate 12 of FIG. 1A and the encapsulant layer 50 of FIG. 1D may be a web of a polymeric material having an indefinite length. The web may be used in a high-speed, roll-to-roll manufacturing process to electrically connect circuit components to rapidly produce low-cost circuits for electronic devices including, for example, radio-frequency identification (RFID) tags, near field communication (NFC) circuits, Bluetooth circuits, Wi-Fi circuits, microprocessor chips, and the like.

In the present disclosure, the electrically conductive particle-containing liquid delivered into the microchannels can automatically register with the contact pads on circuit dies by wetting out, in some cases simply via capillary action, various surfaces of registration features and circuit dies on the substrate (e.g., channel walls, side walls of the pocket, side surfaces of the circuit die, etc.). In some embodiments, the flow of the electrically conductive particle-containing liquid in the microchannels can be automatically directed at least in part by capillary force, which makes optional the use of fluid pumps, vacuum and the like to pump the electrically conductive fluid toward the circuit die or the conductive traces registered with the substrate. After the automatic registration, the electrically conductive particle-containing liquid can be further solidified to form a solid, continuous electrically conductive trace. The process can be repeated as many times as necessary to form a multilayer structure aligned with the solid circuit die on the substrate.

When electrically conductive traces are formed and automatically registered with contact pads on circuit dies, the traces can be connected concurrently, or at a later time, to other portions of a circuit or other circuits or devices. In some embodiments, additional metal traces (e.g., Cu traces) can be patterned in registration to the electrically conductive traces. In some embodiments, for example, the electrically conductive traces can be connected to an antenna coil of an electronic device such as a receiver or transmitter. In some example embodiments, which are not intended to be limiting, the processes described herein can be used to make various chip-based circuits/devices including, for example, radio-frequency identification (RFID) tags, near field communication (NFC) circuits, Bluetooth circuits, Wi-Fi circuits, microprocessor chips, and the like.

Example

A ST Microelectronics M24LR04E bare NFC die included on an underside 8 gold circuit pads of about 0.100 mm by 0.100 mm in size, arranged at a pitch of about 0.40 mm to about 0.45 mm. The wafer of the die had a thickness of about 0.725 mm. Terminals AC0 and AC1 on the die were selected to contact with circuit traces.

An arrangement ridges was formed in a PDMS substrate, and the ridges were designed to create registered interconnects between the selected terminals AC0 and AC1 on the NFC die and a circuit trace.

The circuit die was placed on the ridges in the soft PDMS material using a pick and place machine with an applied force of about 50-100 grams for about 30 seconds. The smooth surface of the ridges on the PDMS substrate made a reversible seal with the terminals on the circuit die.

A curable liquid prepolymer was brought into contact with the chip and the PDMS mold. The liquid filled in all the spaces between the circuit die and the mold, but did not contaminate the terminals on the circuit die, courtesy of the reversible seal formed with the PDMS mold surface.

The liquid prepolymer was cured using heat and UV light, and the resulting cured polymer was peeled off the PDMS mold. The circuit die was transferred to the cured polymer, which then formed a carrier for the circuit die. The terminals on the circuit die, which were previously in intimate contact with the PDMS mold, were then exposed with each of the ridges from the PDMS mold forming a microchannel in the cured polymer.

Some of the microchannels in the carrier were then filled with a silver ink, which was dried and hardened at 100° C. for about 5 minutes to create the interconnects with the terminals on the circuit die and complete the fabrication. The interconnects were backfilled with a clear UV curable optical adhesive material to protect the silver ink.

EMBODIMENTS

Embodiment A. A method, comprising:
placing on a pliable mating surface on a major surface of a mold an electronic device comprising an arrangement of contact pads such that at least one contact pad in the arrangement of contact pads presses against the pliable mating surface, wherein the pliable mating surface is on a microstructure in an arrangement of microstructures on the major surface of the mold;
applying a liquid encapsulant material over the electronic device and the major surface of the mold;
hardening the liquid encapsulant material to form a carrier for the electronic device;
separating the mold from the carrier such that the microstructures on the mold form a corresponding arrangement of microchannels in the carrier, wherein the at least one contact pad on the electronic device is exposed in a microchannel in the arrangement of microchannels;
depositing a conductive particle-containing liquid in the microchannel, such that the conductive particle-containing liquid directly contacts the contact pad exposed in the microchannel.

Embodiment B. The method of Embodiment A, further comprising hardening the conductive particle-containing liquid to form an electrically conductive trace that directly contacts the contact pad on the electronic device.

Embodiment C. The method of Embodiments A to B, wherein the pliable mating surface on the microstructure has a cross-sectional width greater than a cross-sectional width of the contact pad.

Embodiment D. The method of Embodiment C, wherein the pliable mating surface on the microstructure has a cross-sectional width at least three times greater than the cross-sectional width of the contact pad.

Embodiment E. The method of any of Embodiments A to D, wherein the microstructures comprise ridges extending away from the major surface of the mold.

Embodiment F. The method of Embodiment E, wherein the ridges are linear.

Embodiment G. The method of any of Embodiments A to F, wherein the pliable mating surface is chosen from thermoplastic polymers, two-step curable materials and PDMS.

Embodiment H. The method of Embodiment G, wherein the pliable mating surface is PDMS.

Embodiment I. The method of any of Embodiments A to H, wherein the mold comprises PDMS.

Embodiment J. The method of any of Embodiments A to I, wherein the contact pad is at least partially embedded in the pliable mating surface.

Embodiment K. The method of any of Embodiments A to J, wherein the carrier is inverted following the separating step, and prior to the forming of the arrangement of microchannels.

Embodiment L. A method, comprising:
placing on a major surface of a mold an electronic device comprising an arrangement of electrically conductive contact pads such that at least one contact pad in the arrangement of contact pads presses against a pliable mating surface on at least one ridge in an arrangement of ridges extending upward from the major surface of the mold;
applying a liquid encapsulant material to cover the electronic device and occupy regions between the electronic device and the mold;
hardening the liquid encapsulant material to form a carrier for the electronic device;
removing the mold from the carrier, wherein a major surface of the carrier comprises an arrangement of channels corresponding to the arrangement of ridges in the mold, and wherein the at least one contact pad is exposed in the channel to form an electrical contact site in an interconnect channel;
inverting the carrier of the electronic device; and
depositing a conductive particle-containing liquid in the interconnect channel, primarily by capillary pressure, such that the conductive particle-containing liquid directly contacts the electrical contact site.

Embodiment M. The method of Embodiment L, further comprising hardening the conductive particle-containing liquid to form an electrically conductive trace that directly contacts the electrical contact site on the electronic device.

Embodiment N. The method of any of Embodiments L to M, wherein the pliable mating surface on the ridge has a cross-sectional width greater than a cross-sectional width of the contact pad on the electronic device.

Embodiment O. The method of any of Embodiments L to N, wherein the pliable mating surface on the ridge has a cross-sectional width at least three times greater than the cross-sectional width of the contact pad.

Embodiment P. The method of any of Embodiments L to O, wherein the pliable mating surface on the ridge of the mold is chosen from thermoplastic polymers, two-step curable materials and PDMS.

Embodiment Q. The method of Embodiment P, wherein the pliable mating surface is PDMS.

Embodiment R. The method of any of Embodiments L to Q, wherein the mold comprises PDMS.

Embodiment S. The method of any of Embodiments L to R, wherein the major surface of the mold comprises a plurality of elongate linear ridges.

Embodiment T. The method of Embodiment S, wherein the ridges have a rectangular cross-sectional shape.

Embodiment U. The method of any of Embodiments L to T, wherein depositing the conductive particle-containing liquid in the interconnect channel comprises positioning the electrical contact site at a first end of the interconnect channel and flowing the conductive particle-containing liquid from a second end of the interconnect channel toward the first end of the interconnect channel, wherein the first and of the interconnect channel is fluidly connected to the second end of the interconnect channel.

Embodiment V. The method of any of Embodiments M to U, wherein the second end of the interconnect channel comprises a source for the conductive particle-containing liquid.

Embodiment W. The method of any of Embodiments M to V, wherein the conductive particle-containing liquid is dispensed into the source and flows from the source to the first end of the interconnect channel.

Embodiment X. The method of any of Embodiments L to W, wherein the liquid encapsulant is chosen from thermoplastic polyester, polyetherimide, epoxy resins, and combinations thereof.

Embodiment Y. The method of Embodiment X, wherein the liquid encapsulant is hardenable by applying at least one of heat or ultraviolet (UV) light.

Embodiment Z. The method of any of Embodiments L to Y, wherein the electronic device is a solid circuit die.

Embodiment AA. The method of Embodiment Z, wherein the solid circuit die is a semiconductor die.

Embodiment BB. The method of any of Embodiments L to AA, wherein the conductive particle-containing liquid comprises a silver-containing ink.

Embodiment CC. The method of any of Embodiments M to BB, wherein hardening the conductive particle-containing liquid to form the conductive trace comprises evaporating a liquid carrier of the conductive particle-containing liquid.

Embodiment DD. A method, comprising:
on a pliable mold with a major surface comprising a plurality of linear ridges extending upward therefrom, at least a portion of the array of ridges configured to correspond to a plurality of electrically conductive contact pads on a solid circuit die, placing the solid circuit die on the major surface of the mold such that at least a portion of the contact pads in the array of contact pads directly contact and releasably seal against mating surfaces on exposed tops of at least a portion of the ridges in the array of ridges;
applying a liquid encapsulant material on the major surface of the mold, wherein the liquid encapsulant material covers the solid circuit die and occupies valley regions between the linear ridges on the mold;
at least partially curing the liquid encapsulant material to form a polymeric carrier for the electronic device;
separating the mold from the polymeric carrier, wherein a major surface of the polymeric carrier comprises a plurality of linear channels corresponding to the array of linear ridges in the mold, and wherein at least a portion of the contact pads on the solid circuit die are exposed in the linear channels to form electrical contact sites;
inverting the polymeric carrier of the solid circuit die;
disposing a conductive particle-containing liquid in a second end of the linear channels such that the conductive particle-containing liquid flows along the linear channels via capillary pressure from the second end to the first end thereof and directly contacts the exposed electrical contact sites; and
hardening the conductive particle-containing liquid to form a plurality of solid electrically conductive traces directly contacting the electrical contact sites on the solid circuit die.

Embodiment EE. An article comprising:
a solid circuit die comprising a plurality of electrically conductive contact pads, wherein at least a portion of the contact pads in the array of contact pads directly contact mating surfaces on linear ridges in a plurality of linear ridges extending upward from a major surface of a pliable mold; and a polymeric carrier on the major surface of the pliable mold, wherein the polymeric carrier at least partially encapsulates the solid circuit die, and wherein the polymeric carrier is releasable from the pliable mold along the major surface of the pliable mold to form linear channels corresponding to the ridges in the linear array of ridges and expose for electrical interconnection in the channels at least a portion of the contact pads on the solid circuit die.

Various embodiments of the invention have been described. These and other embodiments are within the scope of the following claims.

The invention claimed is:

1. An article comprising:

microstructures extending upward from a major surface of a pliable mold, wherein the microstructures comprise a pliable mating surface;

a solid circuit die comprising a plurality of electrically conductive contact pads, wherein at least a portion of the contact pads directly contact the pliable mating surfaces of the microstructures; and a polymeric carrier releasably attached to the major surface of the pliable mold, wherein the polymeric carrier at least partially encapsulates the solid circuit die, and wherein the polymeric carrier comprises channels corresponding to the microstructures wherein the channels are interconnected to at least a portion of the contact pads on the solid circuit die.

2. The article of claim 1, wherein the microstructures comprise linear ridges.

3. The article of claim 1, wherein the contact pads are at least partially embedded in the pliable mating surface.

4. The article of claim 1, wherein the pliable mold comprises polydimethylsiloxane.

5. The article of claim 1, wherein the polymeric carrier is selected from the group consisting of thermoplastic polyester, polyetherimide, epoxy resins, and combinations thereof.

* * * * *